(12) United States Patent
Shim et al.

(10) Patent No.: US 11,802,350 B2
(45) Date of Patent: Oct. 31, 2023

(54) LAYERED GAAS, METHOD OF PREPARING SAME, AND GAAS NANOSHEET EXFOLIATED FROM SAME

(71) Applicant: INDUSTRY-ACADEMIC COOPERATION FOUNDATION, YONSEI UNIVERSITY, Seoul (KR)

(72) Inventors: Woo Young Shim, Seoul (KR); Sang jin Choi, Seoul (KR); Hyesoo Kim, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 500 days.

(21) Appl. No.: 17/146,224

(22) Filed: Jan. 11, 2021

(65) Prior Publication Data

US 2021/0130980 A1  May 6, 2021

Related U.S. Application Data

(62) Division of application No. 16/415,681, filed on May 17, 2019, now abandoned.

(30) Foreign Application Priority Data

May 18, 2018 (KR) .......................... 10-2018-0057449

(51) Int. Cl.
*C30B 29/42* (2006.01)
*C30B 11/00* (2006.01)
(Continued)

(52) U.S. Cl.
CPC ............ *C30B 29/42* (2013.01); *C01G 28/002* (2013.01); *C30B 11/003* (2013.01); *C30B 29/68* (2013.01);
(Continued)

(58) Field of Classification Search
CPC ....... C30B 29/42; C30B 11/003; C30B 29/68; C30B 33/08; C01G 28/002;
(Continued)

(56) References Cited

U.S. PATENT DOCUMENTS 4,609,424 A * 9/1986 Shuskus ................ C30B 25/105
118/715
5,639,343 A * 6/1997 Dobkin ................... H01L 22/14
438/746
(Continued)

FOREIGN PATENT DOCUMENTS

| CN | 108004409 | 6/2009 |
|----|-----------|--------|
| CN | 101459206 | 5/2018 |
| KR | 101580211 B1 | 12/2015 |

OTHER PUBLICATIONS

Howlader et al., "Formation of gallium arsenide nanostructures in Pyrex glass", *Nanotechnology*, 24, 2013, 315301, 8 pages.
(Continued)

*Primary Examiner* — Robert M Kunemund
(74) *Attorney, Agent, or Firm* — NORTON ROSE FULBRIGHT US LLP (57) ABSTRACT

The present invention relates to: layered gallium arsenide (GaAs), which is more particularly layered GaAs, which, unlike the conventional bulk GaAs, has a two-dimensional crystal structure, has the ability to be easily exfoliated into nanosheets, and exhibits excellent electrical properties by having a structure that enables easy charge transport in the in-plane direction; a method of preparing the same; and a GaAs nanosheet exfoliated from the same.

5 Claims, 11 Drawing Sheets

(51) Int. Cl.
  *C30B 29/68* (2006.01)
  *H01L 21/02* (2006.01)
  *H01L 29/06* (2006.01)
  *H01L 29/20* (2006.01)
  *C01G 28/00* (2006.01)
  *C30B 33/08* (2006.01)

(52) U.S. Cl.
  CPC ........ *C30B 33/08* (2013.01); *H01L 21/02546* (2013.01); *H01L 21/02623* (2013.01); *H01L 29/0665* (2013.01); *H01L 29/20* (2013.01); *C01P 2002/02* (2013.01); *C01P 2002/72* (2013.01); *C01P 2002/76* (2013.01)

(58) Field of Classification Search
  CPC ......... H01L 21/02546; H01L 21/02623; H01L 29/0665; H01L 29/20; C01P 2002/02; C01P 2002/72; C01P 2002/76
  See application file for complete search history.

(56) References Cited

U.S. PATENT DOCUMENTS

| | | | |
|---|---|---|---|
| 7,582,975 B1* | 9/2009 | Kamins | B82Y 15/00 977/762 |
| 7,682,943 B2* | 3/2010 | Samuelson | H01L 29/882 438/479 |
| 2017/0047223 A1 | 2/2017 | Wang et al. | |
| 2019/0352799 A1* | 11/2019 | Shim | C30B 11/00 |

OTHER PUBLICATIONS

Office Action issued in Korean Patent Application No. 10-2018-0057449, dated May 20, 2019.
Office Action issued in corresponding Chinese Patent Application No. 201910420208.4, dated Nov. 22, 2021.

* cited by examiner

LAYERED GAAS, METHOD OF PREPARING SAME, AND GAAS NANOSHEET EXFOLIATED FROM SAME

CROSS-REFERENCE TO RELATED APPLICATION

This application is a divisional of U.S. patent application Ser. No. 16/415,681, filed May 17, 2019, now abandoned, which claims priority to and the benefit of Korean Patent Application No. 2018-0057449, filed on May 18, 2018, the disclosure of which is incorporated herein by reference in its entirety.

STATEMENT OF GOVERNMENTAL SUPPORT

This invention was supported by the National Research Foundation (NRF) of Korea through grants funded by the Korean government (2018M3D1A1058793).

BACKGROUND

1. Field of the Invention

The present invention relates to layered gallium arsenide (GaAs), a method of preparing the same, and a GaAs nanosheet exfoliated from the same. More particularly, the present invention relates to: layered GaAs, which, unlike conventional bulk GaAs, has a two-dimensional (2D) crystal structure, has the ability to be easily exfoliated into nanosheets, and exhibits excellent electrical properties by having a structure that enables easy charge transport in an in-plane direction; a method of preparing the same; and a GaAs nanosheet exfoliated from the same.

2. Discussion of Related Art

Research on graphene and various other ultra-thin 2D materials based on the novel physical, chemical, mechanical, and optical properties of the materials has been actively conducted in various fields. These low-dimensional materials are expected to provide new breakthrough functions that existing bulk materials do not have, and are highly likely to be next-generation future materials that replace existing materials.

Research on existing 2D materials has been conducted based on the top-down method, in which weak interlayer Van der Waals bonds are broken by physical and chemical means, and the bottom-up method, in which a large-area thin film is grown based on vapor deposition. In particular, the top-down method always requires that the pristine form of a target subject to be exfoliated have a 2D layered crystal structure, and thus researchable subjects thereof are highly limited to graphene without band gap, layered metal oxides/nitrides with low charge mobility, transition metal chalcogen compounds with low electron mobility/low electrical conductivity, and the like.

Due to limitations of the existing research methods, research on 2D materials has been highly limited to materials such as graphene, transition metal chalcogen compounds, and the like. Such existing research methods have limitations in that the possibility of low-dimensional material development is limited, in essence, by the types of elements to be used, and the methods are not suitable for use in the development of low-dimensional future materials out of the myriad of three-dimensional (3D) bulk-type materials not having a layered structure.

Meanwhile, GaAs, which is a typical group III-V semiconducting material, has been widely used in integrated circuits, diodes, solar cells, and the like based on advantages such as direct band gap, high charge mobility, wide band gap, and the like. When fabricated as a 2D material, GaAs can provide very high mobility in an in-plane direction and thus can be a promising candidate for semiconductor device applications.

SUMMARY OF THE INVENTION

The present invention is directed to providing: layered GaAs, which, unlike conventional bulk GaAs, has a 2D crystal structure, has the ability to be easily exfoliated into nanosheets, and exhibits excellent electrical properties by having a structure that enables easy charge transport in the in-plane direction; and a GaAs nanosheet exfoliated from the same.

One aspect of the present invention provides a method of preparing layered GaAs, the method including the steps of: (1) heat-treating a mixture including K or Na powder, Ga powder, and As powder and cooling the same, thereby obtaining a layered compound having a monoclinic crystal structure with the $P2_1/c$ space group and represented by the chemical formula $K_2Ga_2As_3$ or the chemical formula $Na_2Ga_2As_3$; and (2) treating the layered compound with a mixed solution containing a salt capable of selectively removing K ions or Na ions contained in the layered compound and a solvent capable of dissolving the salt, thereby obtaining layered GaAs having a crystalline or an amorphous structure.

According to one exemplary embodiment of the present invention, the salt may be represented by the following Chemical Formula 1.

$$MX_a (2 \leq a \leq 3) \qquad \text{<Chemical Formula 1>}$$

In Chemical Formula 1, M is any one selected among Al, Mg, Zn, Ga, and Mn, and X is any one selected among Cl, Br, and I.

According to one exemplary embodiment of the present invention, the solvent may include at least one selected among water, ethanol, a cyclic carbonate-based solvent, a chain carbonate-based solvent, an ester-based solvent, an ether-based solvent, a nitrile-based solvent, and an amide-based solvent.

According to one exemplary embodiment of the present invention, the heat treatment of Step (1) may be performed at 650 to 800° C. for 6 to 24 hours.

According to one exemplary embodiment of the present invention, the cooling of Step (1) may be performed at a cooling rate of 0.5 to 3° C./hour.

Another aspect of the present invention provides layered GaAs having a crystalline or an amorphous structure.

According to one exemplary embodiment of the present invention, the layered GaAs may not produce a peak at 2θ of 26.9±0.2, 44.6±0.2, 52.8±0.2, 64.9±0.2, and 71.5±0.2 in an X-ray diffraction pattern obtained by a powder X-ray diffraction method using Cu-Kα radiation.

Still another aspect of the present invention provides a GaAs nanosheet exfoliated from the layered GaAs of the present invention and having a crystalline or an amorphous structure.

According to one exemplary embodiment of the present invention, the GaAs nanosheet may have a thickness of 400 nm or less.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, embodiments of the present invention will be described in detail with reference to the accompanying drawings so that those skilled in the art can easily carry out the present invention. The present invention may be embodied in many different forms and is not limited to the embodiments described herein.

The method of preparing layered GaAs according to the present invention will be described.

The method of preparing layered GaAs according to the present invention can be used to prepare a 2D structure from conventional 3D-structured bulk GaAs, and the layered GaAs, unlike the conventional bulk GaAs, is easily exfoliated into single sheets and exhibits excellent electrical properties by having a structure that enables easy charge transport in the in-plane direction.

First, in Step (1), a mixture including K or Na powder, Ga powder, and As powder is heat-treated and then cooled, and thereby a layered compound having a monoclinic crystal structure with the $P2_1/c$ space group and represented by the chemical formula $K_2Ga_2As_3$ or the chemical formula $Na_2Ga_2As_3$ is obtained.

The mixture may be sealed in a reaction vessel and then heat-treated, and the inside of the reaction vessel may be maintained in an inert gas atmosphere.

The material of the reaction vessel may be, for example, alumina, molybdenum, tungsten, or quartz, but any material may be used as long as it does not react with the sample and is not damaged at high temperatures.

Figure 2A:
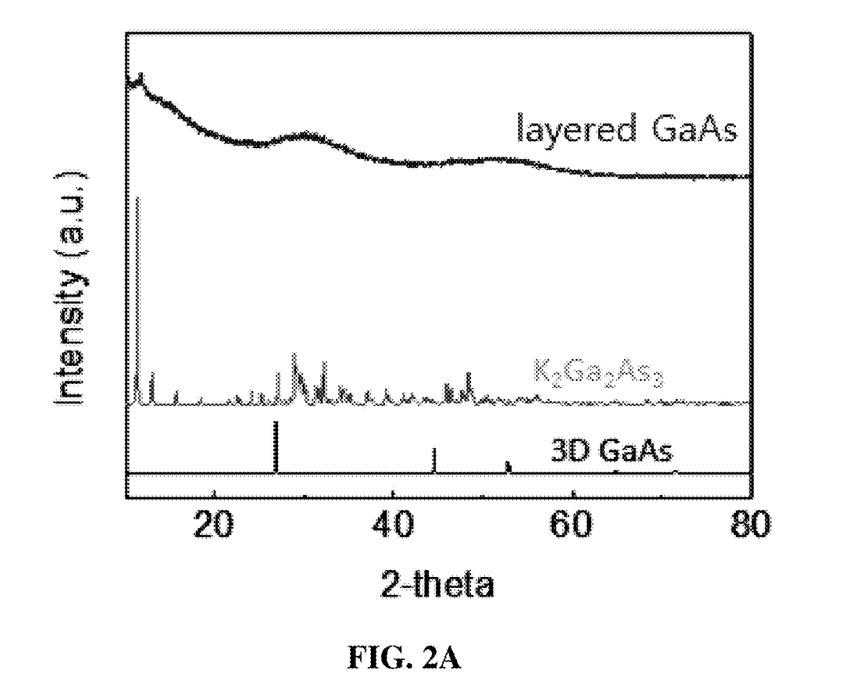
FIGS. 2A and 2B are graphs illustrating X-ray diffraction (XRD) analysis results of layered $K_2Ga_2As_3$ and $Na_2Ga_2As_3$, respectively.

When the above-described mixture includes K powder, Ga powder, and As powder, the layered compound is $K_2Ga_2As_3$ and has a monoclinic crystal structure with the $P2_1/c$ space group, as can be confirmed by the XRD analysis result of $K_2Ga_2As_3$ illustrated in FIG. 2A.

Figure 2B:
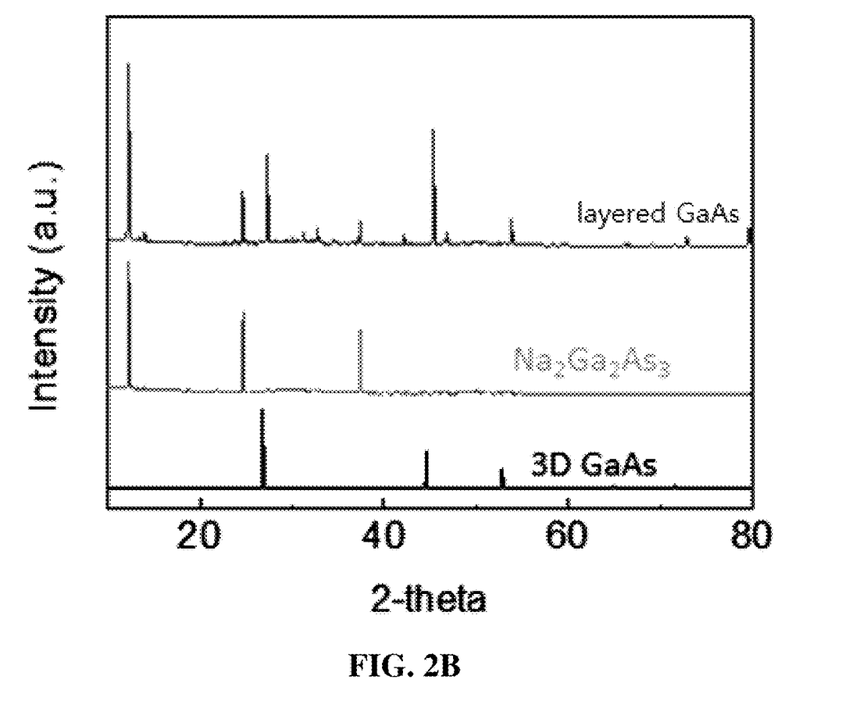

When the above-described mixture includes Na powder, Ga powder, and As powder, the layered compound is $Na_2Ga_2As_3$ and has a monoclinic crystal structure with the $P2_1/c$ space group, as can be confirmed by the XRD analysis result of $Na_2Ga_2As_3$ illustrated in FIG. 2B.

Figure 1A:
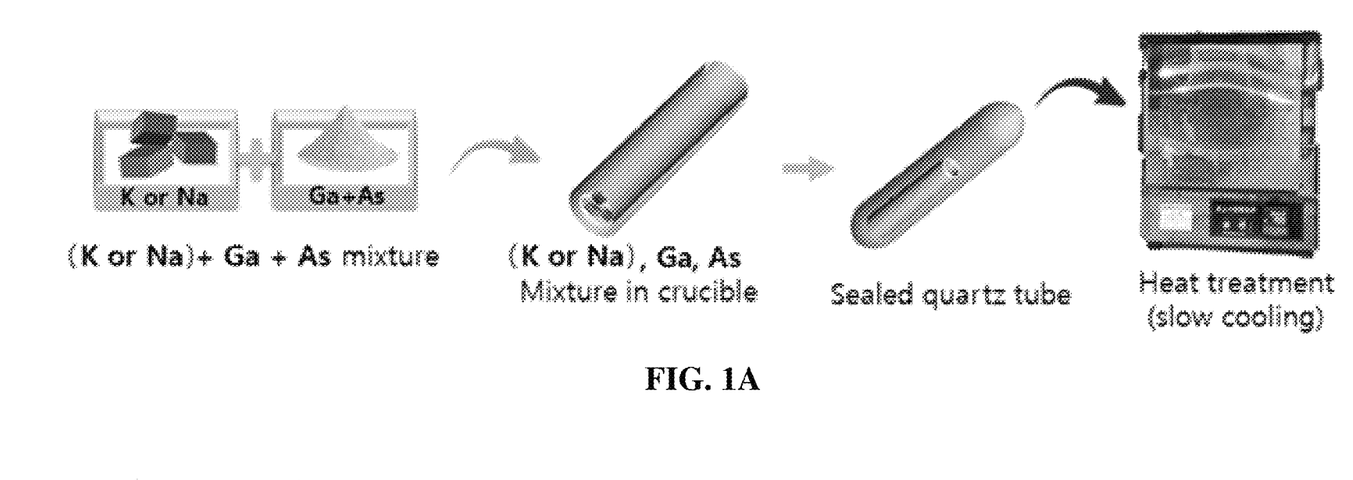
FIG. 1A is a schematic view illustrating a method of preparing layered GaAs according to one exemplary embodiment of the present invention.
Figure 1B:
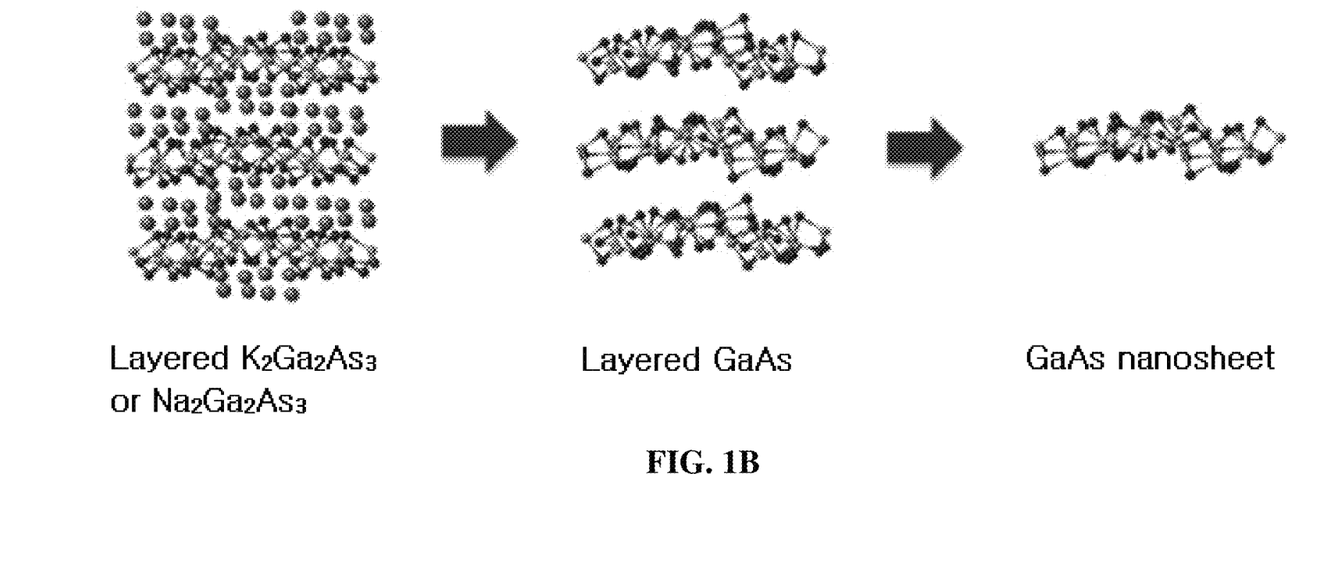
FIG. 1B shows nanostructures of $K_2Ga_2As_3/Na_2Ga_2As_3$, layered (GaAs)s and GaAs nanosheets made therefrom.

FIG. 1 illustrates that the $K_2Ga_2As_3$ or $Na_2Ga_2As_3$ prepared through Step (1) has a 2D crystal structure, unlike GaAs having a 3D crystal structure, and that the selective removal of K ions from the $K_2Ga_2As_3$ or of Na ions from the $Na_2Ga_2As_3$ in Step (2) to be described below results in the preparation of layered GaAs having a crystalline or an amorphous structure.

According to one exemplary embodiment of the present invention, the above-described heat treatment may be performed at 650 to 800° C. for 6 to 24 hours.

When the heat treatment is carried out at a temperature of less than 650° C., some raw materials may remain unreacted because the sintering reaction of the mixture is not completed, and this may lead to problems such as reduction in the yield of the layered compound being prepared and the like. On the other hand, the heat treatment carried out at a temperature of greater than 800° C. may cause the K ions or Na ions to be vaporized, and this may further lead to problems such as damage to the reaction vessel used in the sintering reaction, reduction in the yield of the layered compound being prepared, and the like.

When the heat treatment is carried out for less than six hours, some raw materials may remain unreacted because the sintering reaction of the mixture is not completed, and this may lead to problems such as reduction in the yield of the layered compound being prepared and the like. On the other hand, the heat treatment carried out for more than 24 hours may unnecessarily increase the production time.

The process of cooling after heat treatment is necessary for the crystallization of the layered compound, and the cooling rate may affect the size of a single crystal.

The cooling may be carried out at a cooling rate of 0.5 to 3° C./hour so that the layered compound can develop a monocrystalline structure, and in this case, the size of the layered-GaAs single crystal can be maintained even after the K ions or Na ions contained in the layered compound have been removed. The layered compound can exhibit more excellent charge mobility as a single crystal than as a polycrystal. When the cooling rate is less than 0.5° C./hour, the K ions or Na ions may vaporize, leading to a change in the composition of the material being prepared. On the other hand, when the cooling rate exceeds 3° C./hour, the layered compound being prepared may develop a polycrystalline structure.

Next, in Step (2), the layered compound prepared through Step (1) is treated with a mixed solution containing a salt capable of selectively removing K ions or Na ions contained in the layered compound and a solvent capable of dissolving the salt, whereby the K ions or Na ions are selectively removed and layered GaAs having a crystalline or an amorphous structure is obtained.

More specifically, a layered GaAs having an amorphous structure can be obtained from $K_2Ga_2As_3$, and a layered GaAs having a crystalline structure can be obtained from $Na_2Ga_2As_3$.

The salt may include an anion having high electronegativity and a cation having an electronegativity value between Ga ion and an alkali metal ion contained in the layered compound such that the salt can easily react with the alkali metal ion.

According to one exemplary embodiment of the present invention, the salt may be represented by the following Chemical Formula 1 by consisting of M for representing the cation having an electronegativity value between the alkali metal ion and a Ga ion, and X for representing the anion having high electronegativity.

$$MX_a (2 \leq a \leq 3)$$ <Chemical Formula 1>

In Chemical Formula 1, M may be any one selected among Al, Mg, Zn, Ga, and Mn, and X may be any one selected among Cl, Br, and I.

According to one exemplary embodiment of the present invention, the solvent may include at least one selected among water, ethanol, a cyclic carbonate-based solvent, a chain carbonate-based solvent, an ester-based solvent, an ether-based solvent, a nitrile-based solvent, and an amide-based solvent.

The above-described salt may be used in a sufficient amount to remove the alkali metal ions contained in the layered compound, and is preferably included in an amount such that the layered compound-to-salt molar ratio in the mixed solution is in the range of 1:1 to 1:3. When the layered compound-to-salt molar ratio is greater than 1:1, the desired level of alkali-metal ion removal from the layered compound may not be achieved. On the other hand, when the layered compound-to-salt molar ratio is less than 1:3, the salt may not be dissolved in the mixed solution, which may further lead to problems such as sedimentation and the like.

Step (2) may be carried out at a temperature at which the alkali-metal ion removal reaction can take place smoothly. While the temperature may vary according to the composition of the mixed solution, Step (2) is preferably carried out at a temperature of no less than 20° C., and more preferably at a temperature of 20 to 60° C. When Step (2) is carried out at a temperature of less than 20° C., the desired level of alkali-metal ion removal may not be achieved, or the layered structure of the layered compound being prepared may be disrupted. Likewise, when Step (2) is carried out at a temperature of greater than 60° C., the layered structure of the layered compound being prepared may be disrupted. On the other hand, when Step (2) is carried out at a temperature of 20 to 60° C., a high level of alkali-metal ion removal can be achieved while the layered compound being prepared maintains the layered structure.

While Step (2) may be carried out multiple times depending on the composition of the mixed solution and the level of K ion or Na ion removal, it is preferable to perform Step (2) once so that the layered GaAs being prepared can maintain the layered structure.

Meanwhile, the completion of Step (2) may result in the presence of not only the layered GaAs but also a product formed by the reaction between the alkali metal ions and the salt, and therefore the powder obtained through Step (2) may be washed with a solvent for the purpose of removing the above-described product.

The solvent used to remove the product may be at least one selected among water, deionized water, and ethanol, and is preferably deionized water.

Hereinafter, the layered GaAs of the present invention will be described.

The layered GaAs of the present invention has a crystalline or an amorphous structure, which is unlike the crystal structure of conventional 3D bulk GaAs. Therefore, the layered GaAs of the present invention has the ability to be easily exfoliated into nanosheets, and can exhibit excellent electrical properties by having a structure that enables easy charge transport in the in-plane direction.

According to one exemplary embodiment of the present invention, the layered GaAs may not produce a peak at $2\theta$ of 26.9±0.2, 44.6±0.2, 52.8±0.2, 64.9±0.2, and 71.5±0.2 in an X-ray diffraction pattern obtained by a powder X-ray diffraction method using Cu-Kα radiation.

Hereinafter, the GaAs nanosheet of the present invention will be described.

The GaAs nanosheet of the present invention may be obtained by the exfoliation of the layered GaAs of the present invention into nanosheets, and has a crystalline or an amorphous structure.

The exfoliation of the layered GaAs into nanosheets may be carried out by any known method of exfoliating a layered material in the art. For example, any one among exfoliation with energy generated by ultrasonic waves, exfoliation by solvent penetration, exfoliation with a tape, and exfoliation with a material having an adhesive surface may be used.

The GaAs nanosheet exfoliated from the layered GaAs of the present invention may have a thickness of 400 nm or less.

Meanwhile, the layered GaAs and GaAs nanosheet of the present invention may be used in a light-emitting diode (LED). Specifically, the LED may include a first electrode, a light-emitting layer, and a second electrode. Here, the layered GaAs or GaAs nanosheet of the present invention may be included in the light-emitting layer, and the excellent charge mobility of the layered GaAs or GaAs nanosheet of the present invention can result in an improvement in the light-emitting efficiency of the LED. Since the LED of the present invention has a configuration known in the art, a detailed description thereof will be omitted.

In addition, the layered GaAs and GaAs nanosheet of the present invention may be used in an integrated circuit. Specifically, the layered GaAs or GaAs nanosheet of the present invention may be included in a semiconductor chip found in the integrated circuit. For example, the semiconductor chip may be produced by providing a layer including the layered GaAs or GaAs nanosheet of the present invention on a silicon wafer. Since the integrated circuit of the present invention, except for the semiconductor chip included therein, has a configuration known in the art, a detailed description thereof will be omitted.

In addition, the layered GaAs and GaAs nanosheet of the present invention may be used in a solar cell. Specifically, the layered GaAs or GaAs nanosheet of the present invention having excellent charge mobility may be included in a photoactive layer found in the solar cell to result in an improvement in the photoelectric conversion efficiency of the solar cell. Since the solar cell of the present invention, except for the photoactive layer included therein, has a configuration known in the art, a detailed description thereof will be omitted.

Although one exemplary embodiment of the present invention has been described above, it is to be understood that the scope of the present invention is not limited to the exemplary embodiment disclosed herein. Also, those skilled in the art who understand the spirit of the present invention will recognize that other embodiments may be easily suggested by adding, changing, deleting or supplementing elements within the scope of the present invention, and it is to be understood that such other embodiments are also encompassed within the scope of the present invention.

EXAMPLES (Preparation Example 1) Preparation of Layered $K_2Ga_2As_3$

A predetermined amount of K powder was mixed with a predetermined amount of Ga powder and As powder, and the mixture was sealed in a quart tube in an inert gas atmosphere. The quartz tube containing the sample was heat-treated for 10 hours at 750° C. Afterwards, the tube was cooled at a cooling rate of 0.5 to 3° C./hr for $K_2Ga_2As_3$ recrystallization, thereby obtaining a $K_2Ga_2As_3$ single crystal having a monoclinic crystal structure with the $P2_1/c$ space group.

(Preparation Example 2) Preparation of Layered $Na_2Ga_2As_3$

A predetermined amount of Na powder was mixed with a predetermined amount of Ga powder and As powder, and the mixture was sealed in a quartz tube in an inert gas atmosphere. The quartz tube containing the sample was heat-treated for 10 hours at 750° C. Afterwards, the tube was cooled at a cooling rate of 1° C./hr for $Na_2Ga_2As_3$ recrystallization, thereby obtaining a $Na_2Ga_2As_3$ single crystal having a monoclinic crystal structure with the $P2_1/c$ space group.

(Example 1) Preparation of Layered GaAs

The $K_2Ga_2As_3$ prepared in Preparation Example 1 was mixed with deionized water, ethanol, and $AlCl_3$ to remove K ions therefrom, and after washed with deionized water to remove KCl, layered GaAs having an amorphous structure was obtained.

(Example 2) Preparation of GaAs Nanosheet

The layered GaAs prepared in Example 1 was subjected to exfoliation with a Scotch™ pressure-sensitive adhesive tape (3M), and thereby a GaAs nanosheet was obtained.

(Example 3) Preparation of Layered GaAs

The $Na_2Ga_2As_3$ prepared in Preparation Example 2 was mixed with deionized water and $GaCl_3$ to remove Na ions therefrom, and after washed with methanol to remove NaCl, layered GaAs having a crystal structure was obtained.

(Example 4) Preparation of GaAs Nanosheet

The layered GaAs prepared in Example 3 was subjected to exfoliation with a Scotch™ pressure-sensitive adhesive tape (3M), and thereby a GaAs nanosheet was obtained.

(Comparative Example 1) 3D Bulk GaAs

A commercially-available 3D bulk GaAs (Sigma-Aldrich, SKU No.: 329010) was used.

(Experimental Example 1) XRD Analysis

Figure 2C:
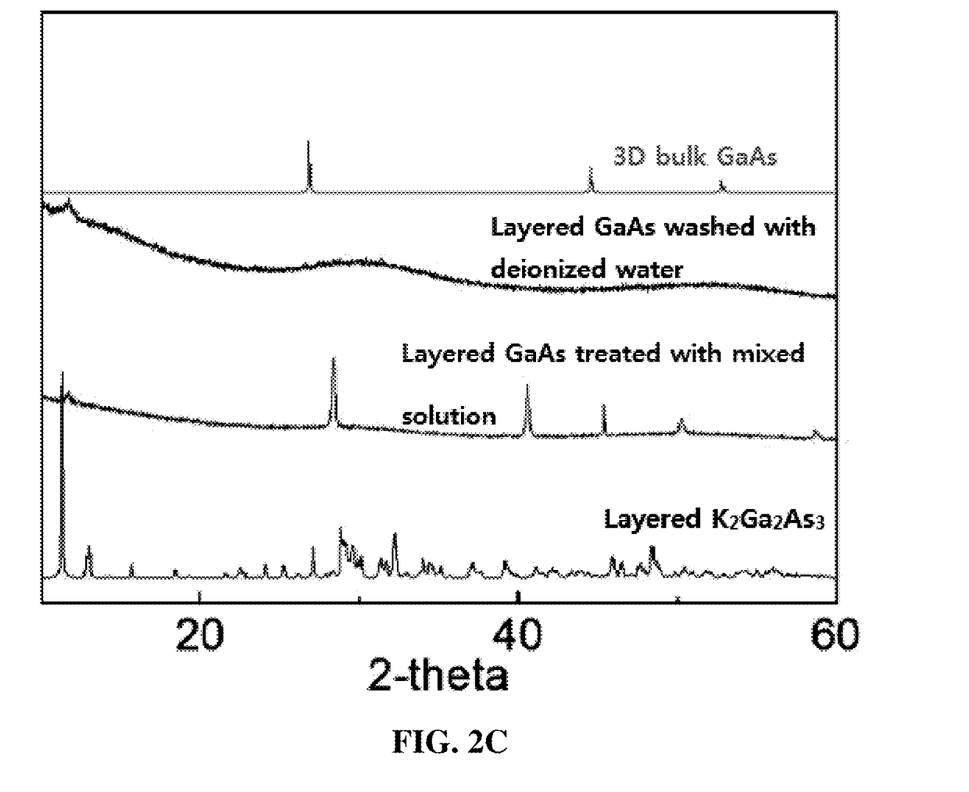
FIG. 2C is a graph illustrating XRD analysis results of layered $K_2Ga_2As_3$, layered GaAs having been treated with a mixed solution, layered GaAs having been washed with deionized water, and 3D bulk GaAs.

The GaAs of Comparative Example 1, and the samples prepared according to Preparation Examples 1 and 2, Examples 1 to 4 were analyzed by XRD, and the results are illustrated in FIGS. 2A to 2C.

FIG. 2A confirms that the layered $K_2Ga_2As_3$ (Preparation Example 1) was synthesized as a high-purity single crystal, and FIG. 2B confirms that the layered $Na_2Ga_2As_3$ (Preparation Example 2) was synthesized as a high-purity single crystal.

FIG. 2C confirms that the layered GaAs (Example 1) prepared by treating the layered $K_2Ga_2As_3$ with a mixed solution to remove K ions and subsequent washing with deionized water has an amorphous structure, which is unlike the structure of the 3D-structured bulk GaAs.

(Experimental Example 2) SEM Analysis

Figure 3A:
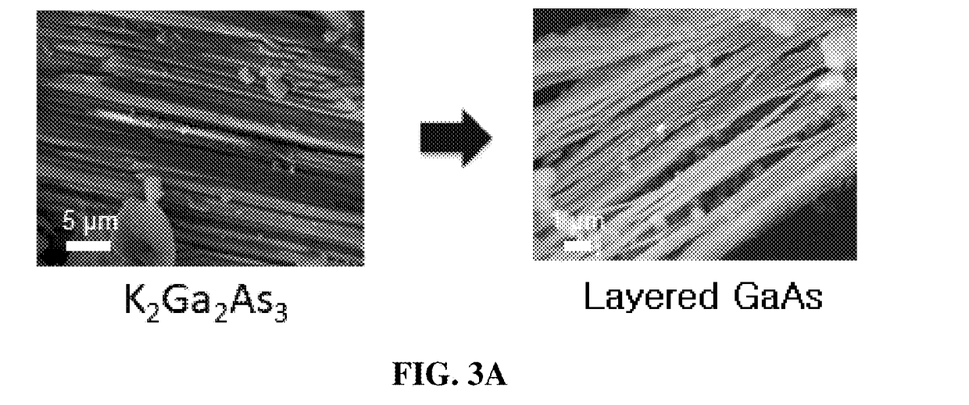
FIG. 3A shows scanning electron microscope (SEM) images of the layered $K_2Ga_2As_3$ and the layered GaAs obtained therefrom.
Figure 3B:
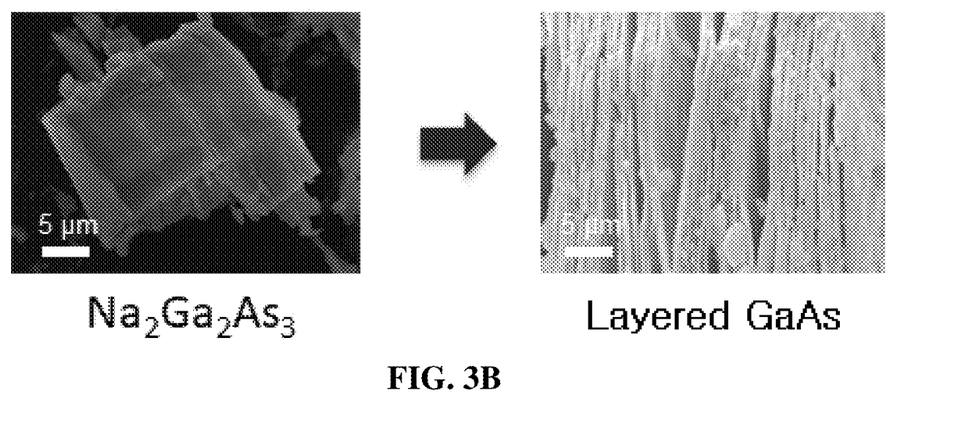
FIG. 3B shows SEM images of the layered $Na_2Ga_2As_3$ and the layered GaAs obtained therefrom.
Figure 3C:
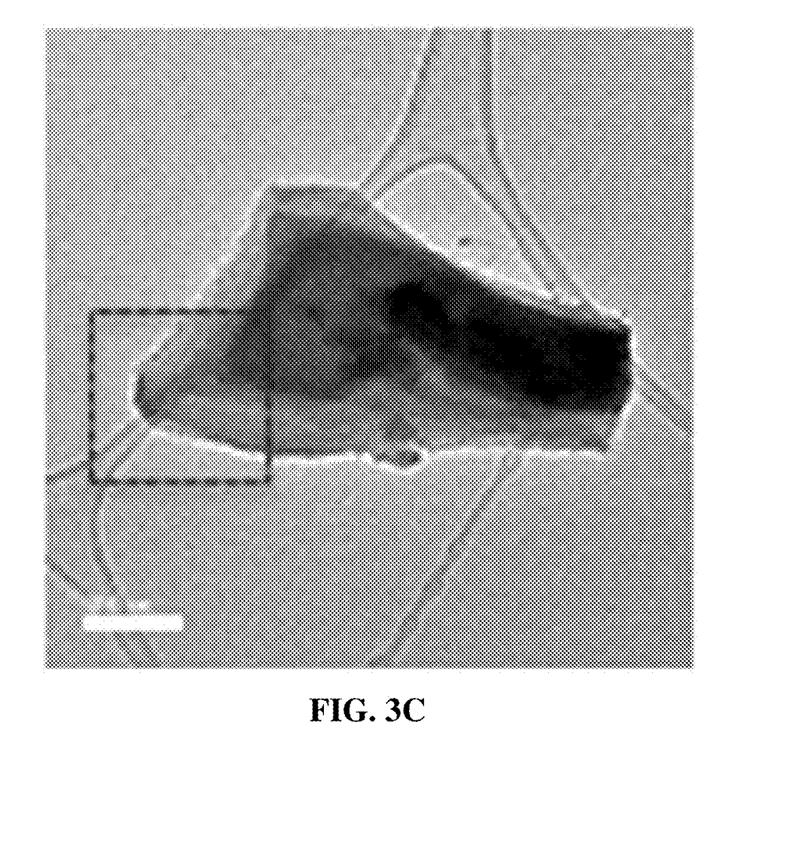
FIG. 3C is an TEM image of a GaAs nanosheet according to one exemplary embodiment of the present invention.

SEM images of the samples prepared according to Preparation Example 1 and 2, Example 1 to 4 were taken, and the results are illustrated in FIGS. 3A to 3C.

FIGS. 3A and 3B confirm that the GaAs prepared from the layered $K_2Ga_2As_3$ (Preparation Example 1) and $Na_2Ga_2As_3$ (Preparation Example 2) has a layered structure.

In addition, FIG. 3C confirms that the GaAs nanosheet has a thin plate-like structure.

(Experimental Example 3) EDS Analysis

Figure 4A:
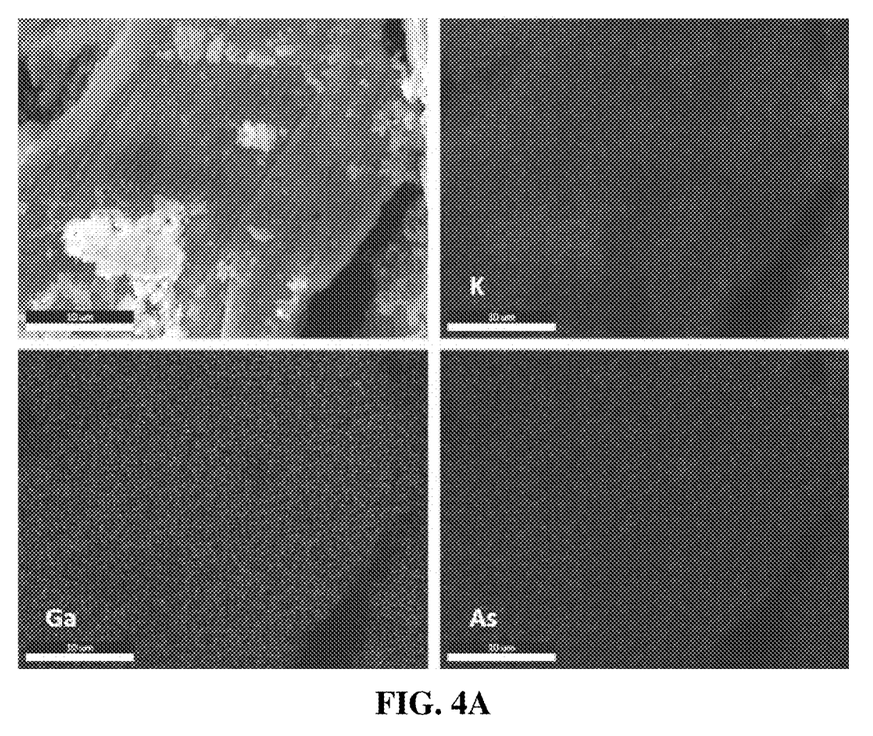
FIG. 4A shows images illustrating energy-dispersive X-ray spectroscopy (EDS) analysis results of layered $K_2Ga_2As_3$.
Figure 4B:
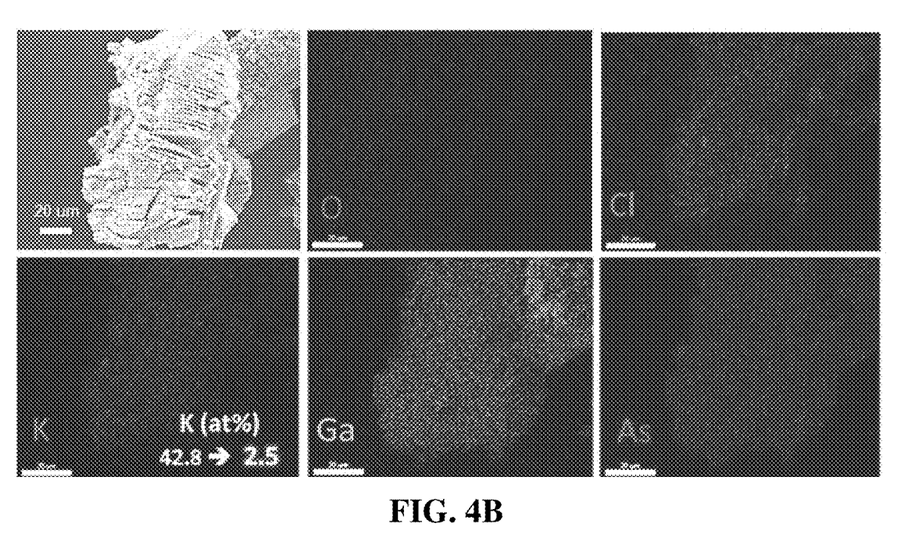
FIG. 4B shows images illustrating EDS analysis results of layered GaAs according to one exemplary embodiment of the present invention.

The samples prepared according to Preparation Example 1 and Example 1 were analyzed by EDS, and the results are illustrated in FIGS. 4A and 4B.

FIGS. 4A and 4B confirm that the treatment of the layered $K_2Ga_2As_3$ (Preparation Example 1) with a mixed solution capable of selectively removing K ions can significantly reduce the K element content of the layered GaAs being prepared.

(Experimental Example 4) TEM Analysis

Figure 5A:
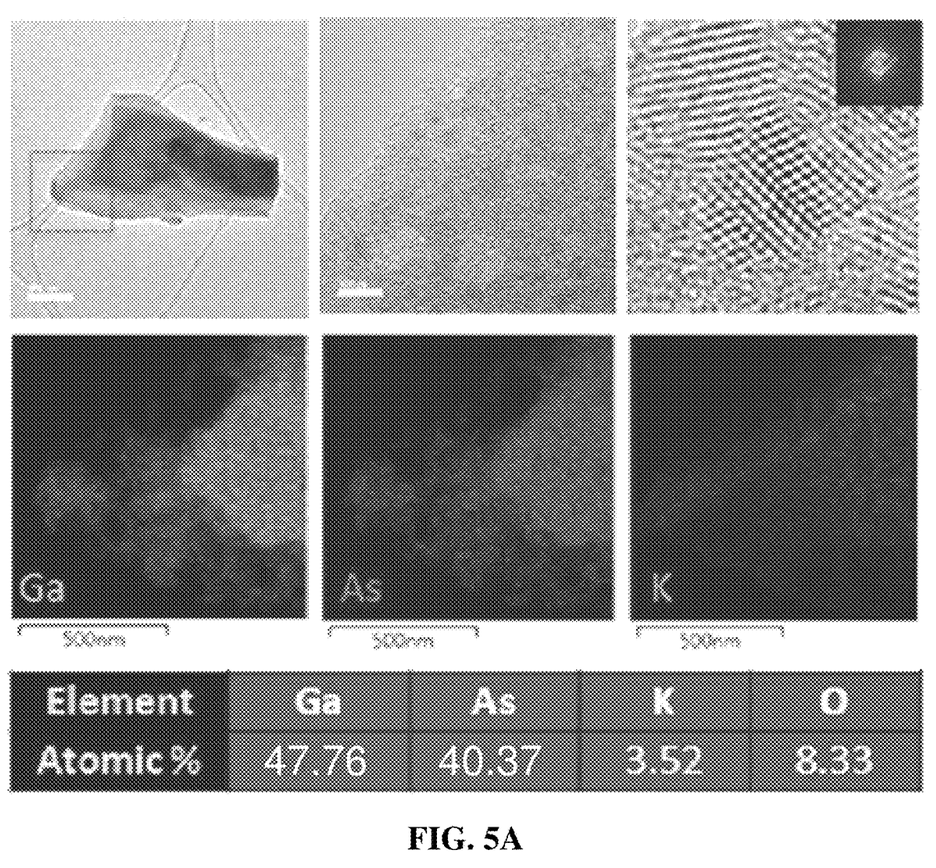
FIG. 5A shows transmission electron microscope (TEM) images, EDS analysis image, EDS mapping, and an elements' atomic proportion table of a layered GaAs obtained from layered $K_2Ga_2As_3$ according to one exemplary embodiment of the present invention.
Figure 5B:
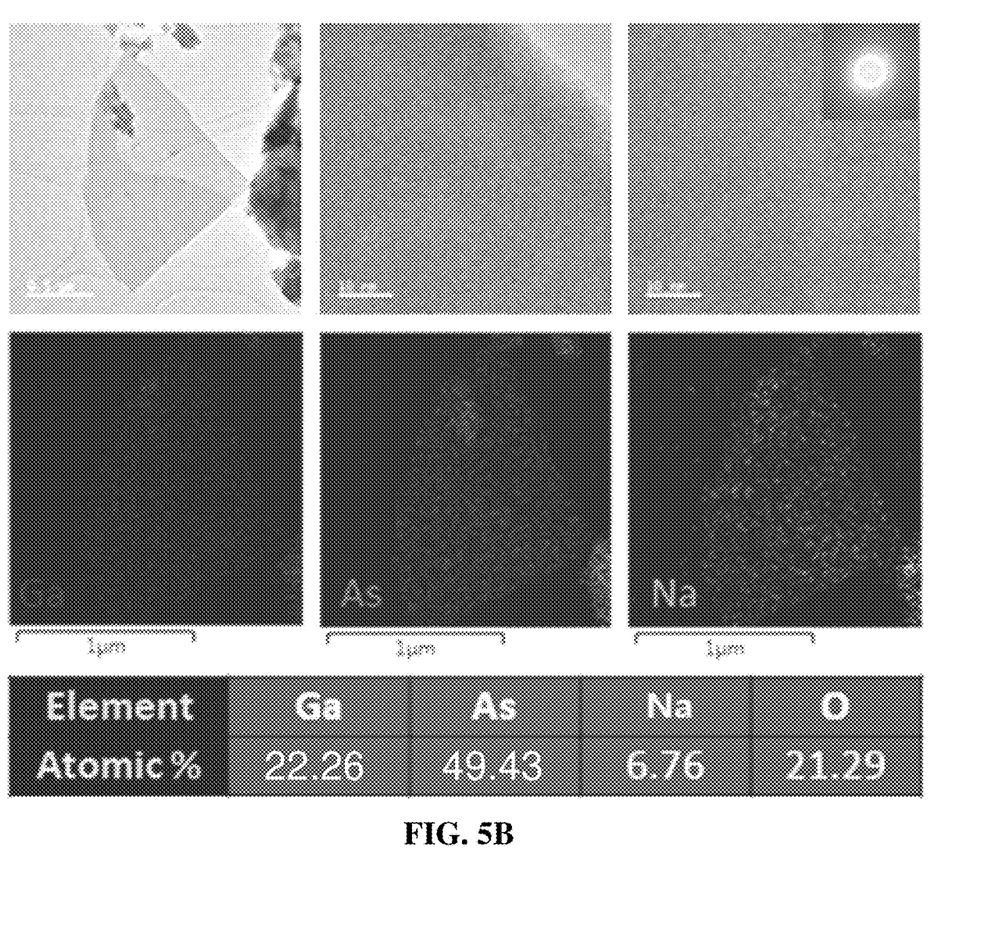
FIG. 5B shows TEM images, EDS analysis image, EDS mapping, and an elements' atomic proportion table of a layered GaAs obtained from layered $Na_2Ga_2As_3$ according to one exemplary embodiment of the present invention.

The GaAs nanosheets prepared according to Example 2 and 4 were analyzed by TEM, and the results are illustrated in FIGS. 5A and 5B.

FIGS. 5A and 5B confirm that the GaAs exfoliated from the layered GaAs is in the form of a nanosheet.

(Experimental Example 5) AFM Analysis

Figure 6A:
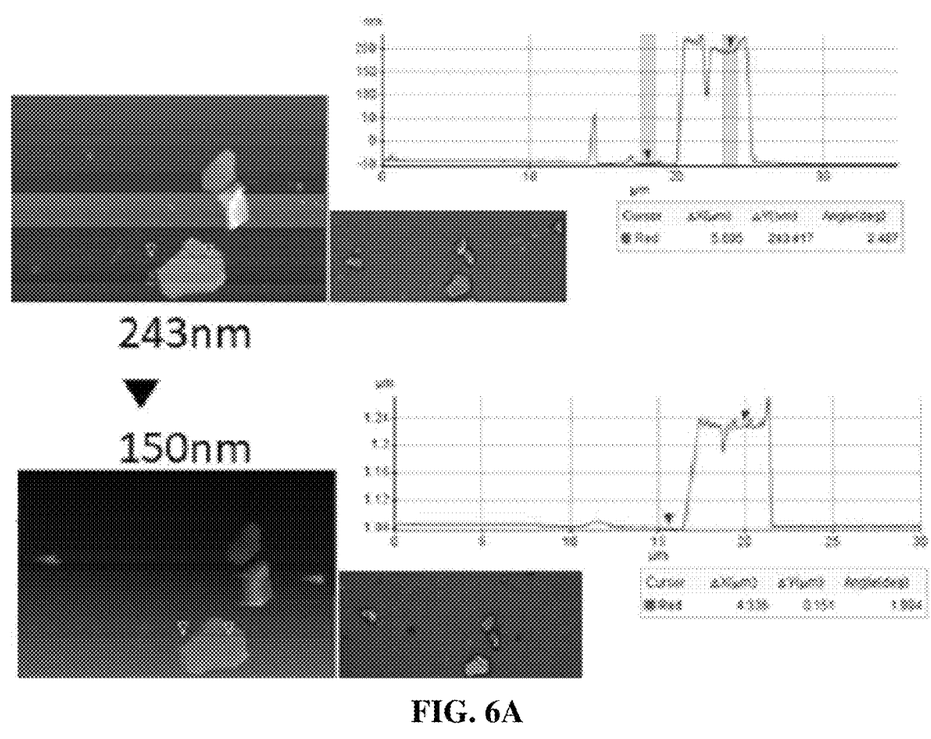
FIG. 6A shows images and graphs illustrating atomic force microscope (AFM) results of a GaAs nanosheet obtained from $K_2Ga_2As_3$ according to one exemplary embodiment of the present invention.

The $K_2Ga_2As_3$ nanosheet obtained by exfoliating the layered $K_2Ga_2As_3$ prepared according to Preparation Example 1 with a tape and the GaAs nanosheet obtained by mixing the $K_2Ga_2As_3$ nanosheet with deionized water, ethanol, and $AlCl_3$ to remove K ions from the $K_2Ga_2As_3$ nanosheet were analyzed by AFM, and the results are illustrated in FIG. 6A.

Figure 6B:
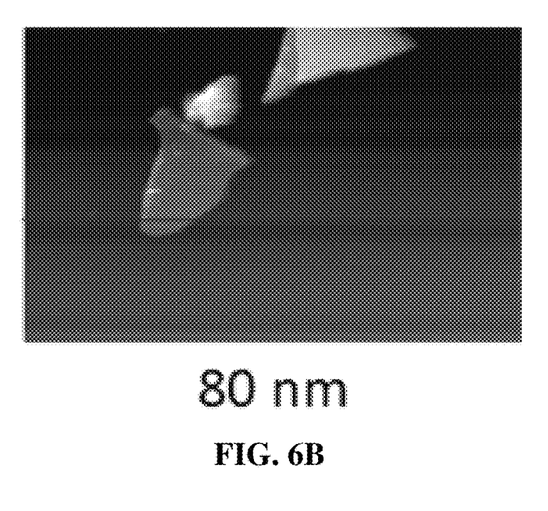
FIG. 6B shows an image illustrating atomic AFM analysis result of a GaAs nanosheet obtained from $Na_2Ga_2As_3$, according to one exemplary embodiment of the present invention.

The $Na_2Ga_2As_3$ nanosheet obtained by exfoliating the layered $Na_2Ga_2As_3$ prepared according to Preparation Example 2 with a tape and the GaAs nanosheet obtained by mixing the $Na_2Ga_2As_3$ nanosheet with deionized water and $GaCl_3$ to remove Na ions from the $Na_2Ga_2As_3$ nanosheet were analyzed by AFM, and the results are illustrated in FIG. 6B.

FIG. 6A confirms that the removal of K ions from the $K_2Ga_2As_3$ nanosheet and the resulting reduction of nanosheet thickness resulted in the preparation of a GaAs nanosheet having a thickness of 150 nm.

FIG. 6B confirms that the removal of Na ions from the $Na_2Ga_2As_3$ nanosheet and the resulting reduction of nanosheet thickness resulted in the preparation of a GaAs nanosheet having a thickness of 80 nm.

(Experimental Example 6) X-Ray Photoelectron Spectroscopy Analysis

Figure 7:
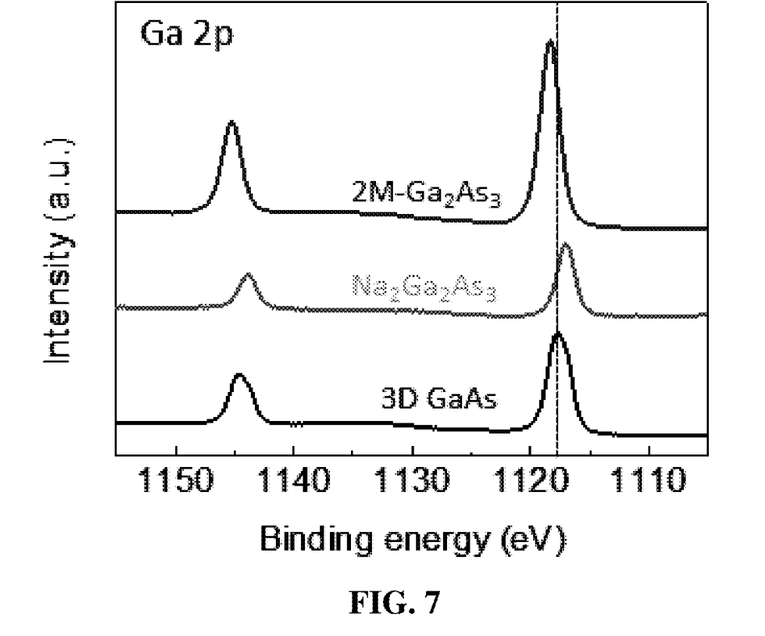
FIG. 7 is X-ray photoelectron spectroscopy analysis results of $Na_2Ga_2As_3$ and layered GaAs, respectively synthesized according to an exemplary embodiment of the present invention, and 3D bulky GaAs, with regard to Ga 2p orbital.

The layered GaAs's of Preparation Example 2 and Example 3, and the 3D bulky GaAs of Comparative Example 1 were subjected to X-ray photoelectron spectroscopy analysis and the results are illustrated in FIG. 7.

FIG. 7 confirms that the Ga of the layered GaAs according to the present invention has a different charge states from the Ga of the 3D bulky GaAs and the Ga of the $Na_2Ga_2As_3$ before the treatment with the mixed solution.

(Experimental Example 7) Raman Analysis

Figure 8:
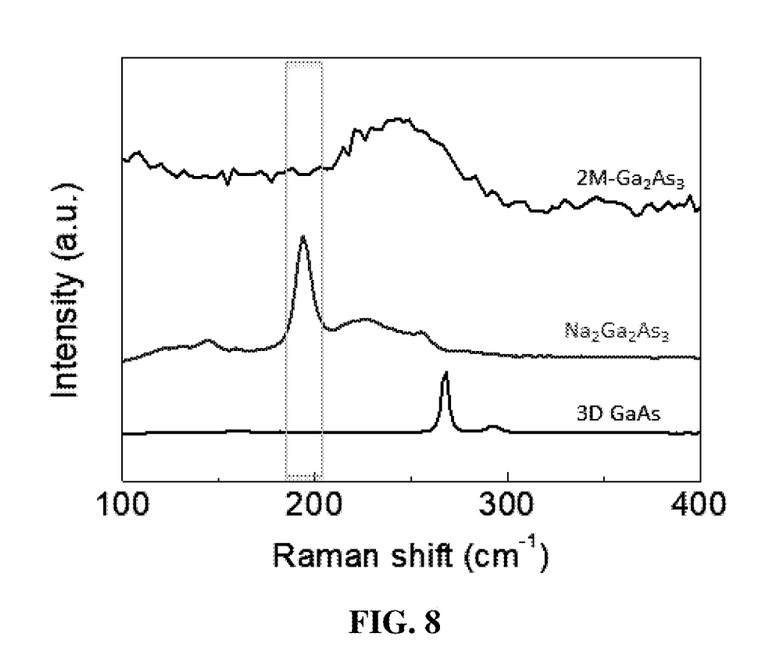
FIG. 8 is Raman analysis results of $Na_2Ga_2As_3$ and layered GaAs obtained from the $Na_2Ga_2As_3$, each of which synthesized according to an exemplary embodiment of the present invention, and of bulky GaAs.

The layered GaAs's of Preparation Example 2 and Example 3, and the 3D bulky GaAs of Comparative Example 1 were subjected to Raman analysis, and the results are shown in FIG. 8.

Referring to FIG. 8, it can be seen that the peak near 200 cm-1 disappears by the mixed solution treatment, from which it is confirmed that Na is removed, and the interaction between Na and other atoms disappeared.

(Experimental Example 8) Cross-Section STEM Image Analysis

Figure 9:
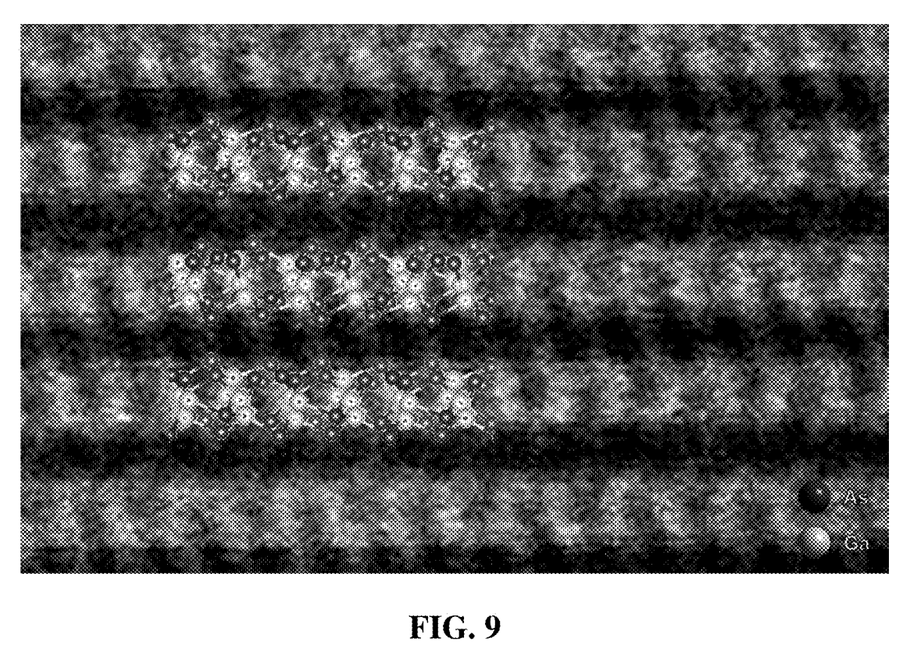
FIGS. 9 and 10 are cross-section STEM images of the layered GaAs obtained from the $Na_2Ga_2As_3$, synthesized according to an exemplary embodiment of the present invention, zone axis of which are [100] and [010], respectively.
Figure 10:
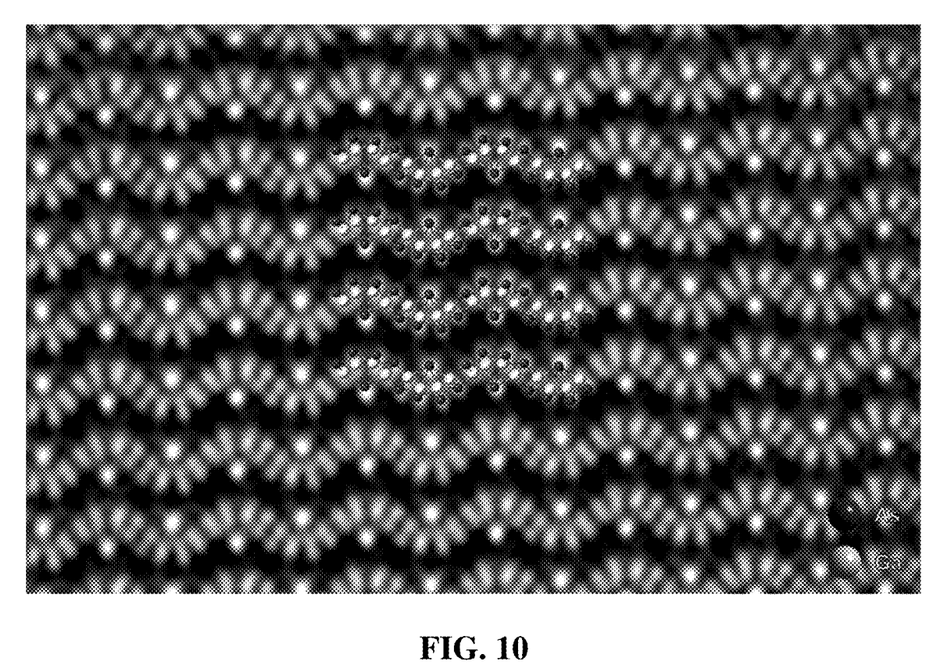

Cross-section STEM photographs of the layered GaAs of Example 3 for zone axis [100] and [010] are shown in FIGS. 9 and 10, respectively.

Referring to FIGS. 9 and 10, it can be seen that the Na atoms existing between the respective layers are removed.

(Experimental Example 9) Photoluminescence Analysis

Figure 11A:
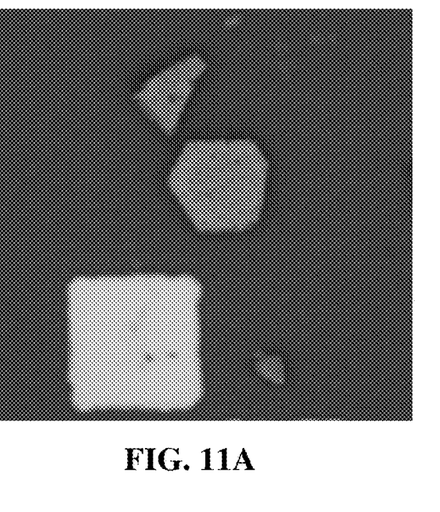
FIG. 11A is an OM (optical microscope) image of layered GaAs obtained from $Na_2Ga_2As_3$.
Figure 11B:
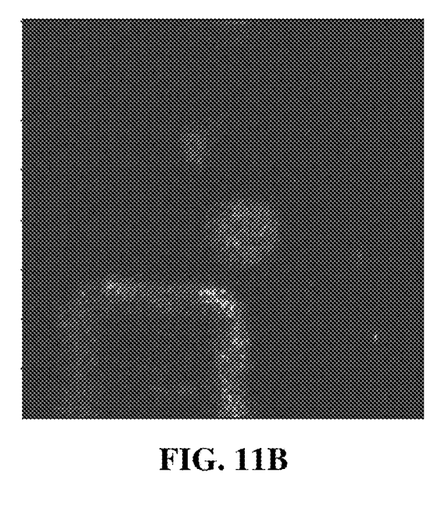
FIG. 11B is a photoluminescence mapping image thereof.
Figure 11C:
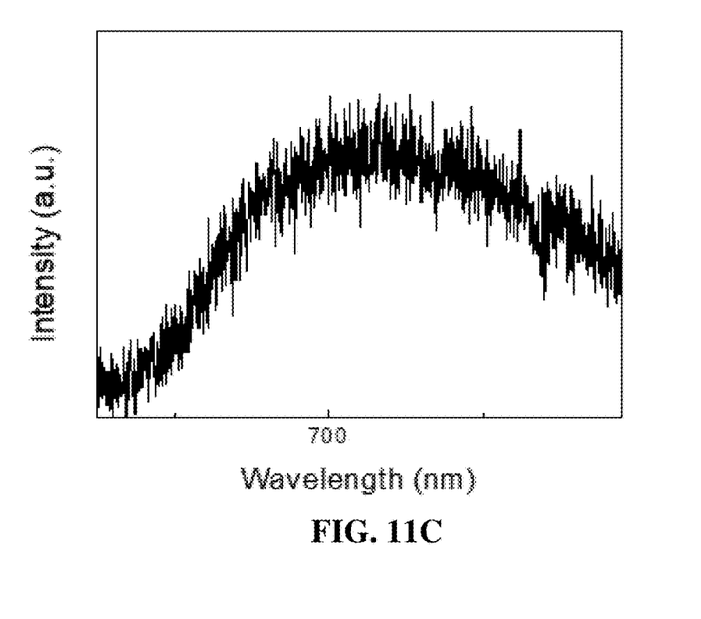
FIG. 11C is a photoluminescence peak data thereof.

The photoluminescent characteristics of the layered GaAs of Example 3 were analyzed by photoluminescence test and are shown in FIGS. 11B and 11C.

Referring to FIG. 11C, it is found that peaks are generated in the vicinity of 710 nm, which is different from that of 3D GaAs which generates a peak in the vicinity of 830 nm.

Since, unlike conventional bulk GaAs, the layered GaAs of the present invention has a 2D crystal structure, has the ability to be easily exfoliated into nanosheets, and exhibits excellent electrical properties by having a structure that enables easy charge transport in an in-plane direction, it can be widely used in semiconductor devices.

What is claimed is:

1. A method of preparing layered GaAs, the method comprising:
   step (1) of heat-treating a mixture including K or Na powder, Ga powder, and As powder and cooling the mixture, thereby obtaining a layered compound having a monoclinic crystal structure with the $P2_1/c$ space group and represented by the chemical formula $K_2Ga_2As_3$ or the chemical formula $Na_2Ga_2As_3$; and
   step (2) of treating the layered compound with a mixed solution containing a salt capable of selectively removing K ions or Na ions contained in the layered compound and a solvent capable of dissolving the salt, thereby obtaining layered GaAs having a crystalline or an amorphous structure.

2. The method of claim 1, wherein the salt is represented by the following Chemical Formula 1:

$MX_a(2 \leq a \leq 3)$ <Chemical Formula 1> wherein, in Chemical Formula 1, M is any one selected among Al, Mg, Zn, Ga, and Mn, and X is any one selected among Cl, Br, and I.

3. The method of claim 1, wherein the solvent includes at least one selected among water, ethanol, a cyclic carbonate-based solvent, a chain carbonate-based solvent, an ester-based solvent, an ether-based solvent, a nitrile-based solvent, and an amide-based solvent.

4. The method of claim 1, wherein the heat treatment of the step (1) is carried out at 650 to 800° C. for 6 to 24 hours.

5. The method of claim 1, wherein the cooling of the step (1) is carried out at a cooling rate of 0.5 to 3° C./hour.

* * * * *